United States Patent
Patterson et al.

(10) Patent No.: US 7,547,560 B2
(45) Date of Patent: Jun. 16, 2009

(54) DEFECT IDENTIFICATION SYSTEM AND METHOD FOR REPAIRING KILLER DEFECTS IN SEMICONDUCTOR DEVICES

(75) Inventors: Oliver Desmond Patterson, Windermere, FL (US); David M. Shuttleworth, Orlando, FL (US); Bradley J. Albers, Dallas, TX (US); Werner Weck, Orlando, FL (US); Gregory Brown, Ocoee, FL (US)

(73) Assignee: Agere Systems Inc., Allentown, PA (US)

( * ) Notice: Subject to any disclaimer, the term of this patent is extended or adjusted under 35 U.S.C. 154(b) by 458 days.

(21) Appl. No.: 11/519,614

(22) Filed: Sep. 12, 2006

(65) Prior Publication Data

US 2007/0010032 A1 Jan. 11, 2007

Related U.S. Application Data

(63) Continuation of application No. 10/911,142, filed on Aug. 4, 2004, now abandoned.

(60) Provisional application No. 60/571,435, filed on May 14, 2004.

(51) Int. Cl.
*H01L 21/00* (2006.01)

(52) U.S. Cl. .............................. 438/4; 438/14; 382/145; 382/149; 257/E21.252; 257/E21.526

(58) Field of Classification Search ............... 438/4, 438/14; 382/141, 145, 149, 151, 181; 702/35, 702/36

See application file for complete search history.

(56) References Cited

U.S. PATENT DOCUMENTS

| 6,047,083 | A  | * | 4/2000  | Mizuno  | 382/141 |
| 6,205,239 | B1 | * | 3/2001  | Lin et al. | 382/149 |
| 6,335,129 | B1 | * | 1/2002  | Asano et al. | 430/5 |
| 6,884,999 | B1 | * | 4/2005  | Yedur et al. | 250/306 |
| 7,236,847 | B2 | * | 6/2007  | Marella | 700/110 |
| 2005/0224457 | A1 | * | 10/2005 | Satake et al. | 216/59 |

FOREIGN PATENT DOCUMENTS

JP      62177681 A  *  8/1987
JP     405272940 A  * 10/1993

OTHER PUBLICATIONS

"Surface Mount Technology Microbridge Detector", IBM Technical Disclosure Bulletin, vol. 38, No. 5; May 1, 1995; pp. 255-256.*

* cited by examiner

*Primary Examiner*—A. Sefer
*Assistant Examiner*—Farid Khan

(57) ABSTRACT

A method for improving semiconductor yield by in-line repair of defects during manufacturing comprises inspecting dies on a wafer after a selected layer is formed on the dies, identifying defects in each of the dies, classifying the identified defects as killer or non-critical, for each killer defect determining an action to correct the defect, repairing the defect and returning the wafer to a next process step. Also disclosed is a method for determining an efficient repair process by dividing the die into a grid and using analysis of the grid to find a least invasive repair.

22 Claims, 3 Drawing Sheets

DEFECT IDENTIFICATION SYSTEM AND METHOD FOR REPAIRING KILLER DEFECTS IN SEMICONDUCTOR DEVICES

CROSS-REFERENCE TO RELATED APPLICATIONS

This application is a continuation of U.S. application Ser. No. 10/911,142, filed Aug. 4, 2004, which claims the benefit of U.S. Provisional Application No. 60/571,435, filed May 14, 2004.

TECHNICAL FIELD OF THE INVENTION

The present invention is directed, in general, to semiconductor fabrication and, more specifically, to an in-line defect identification system and method for repairing killer defects in semiconductor devices upon detection.

BACKGROUND OF THE INVENTION

In the realm of semiconductor fabrication, systems and methods for maximizing chip yield are critical to the success of a semiconductor manufacturing company. Higher yields allows companies to distribute the manufacturing costs over a greater quantity of products, thereby reducing the sales price or increasing the profit margin.

Optical, laser-based and SEM inspection tools are key pieces of equipment for yield maintenance and improvement. They are used to inspect wafers for defects at numerous points in the production process. Their data is used for three fundamental purposes: statistical process control (SPC), identification and quantification of the defects limiting yield for process improvement purposes, and yield modeling.

Inspection data is generally monitored using SPC since the number of defects is a good indicator of yields. A change in the distribution of defects can indicate a yield problem. Therefore, by monitoring inspection data, the yield problem may be detected in a timely manner. Despite the effectiveness of monitoring data, there is opportunity for improvement. Many types of defects may arise during manufacturing. These defects may be classified as either "killer" or "non-critical" defects. Killer defects cause a malfunction or failure of the semiconductor device, whereas non-critical defects do not substantially affect the performance of the semiconductor device. U.S. Pat. No. 6,047,083 describes one method of identifying defects in semiconductor products during their manufacture and for classifying such defects as "killer" or non-critical. However, once the defect has been identified as "killer", the only solution is to adjust the manufacturing process to attempt to prevent future defects. It is not believed that the industry has addressed the repair of killer defects in order to salvage what otherwise would be defective products.

The majority of the yield loss for integrated circuits is due to killer defects that are a) of sub-micron size, b) the shorting together of elements of a single mask level (such as metal or gate-stack runners), or opens created at these same levels, and c) can be detected using in-line inspection tools such as an inspection SEM. This invention proposes a method of eliminating these defects in-line, thereby improving yield.

DETAILED DESCRIPTION OF THE INVENTION

The majority of the yield lost for integrated circuits is due to defects that are of sub-micron size, involve the shorting together of elements of a single mask level (such as metal or gate stack runners) or the creation of opens at the same levels, and which can be detected using in-line inspection tools. The shorting mechanisms include metal to metal shorts in either copper or aluminum technologies, gate-stack to gate-stack shorts, gate-stack to window shorts and active region to active region shorts. In-line inspection tools are capable of detecting and locating most of these shorted conditions. For example, U.S. Pat. No. 6,047,083 describes a method and apparatus for pattern inspection that can be used to identify killer defects on semiconductor dies. Most killer defects create a single short between two adjacent elements and therefore only need a minor repair to become non-yield limiting. However, the present invention contemplates that killer defects that cause shorts between more than two elements could be repaired by multiple-step corrective action.

Figure 1A:
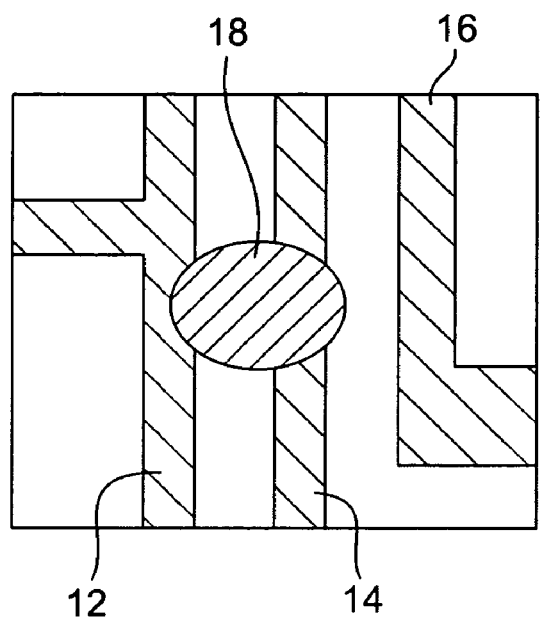
FIGS. 1A and 1B are schematic representations of a metal layer of a semiconductor device or die illustrating a shorting defect and its repair.
Figure 1B:
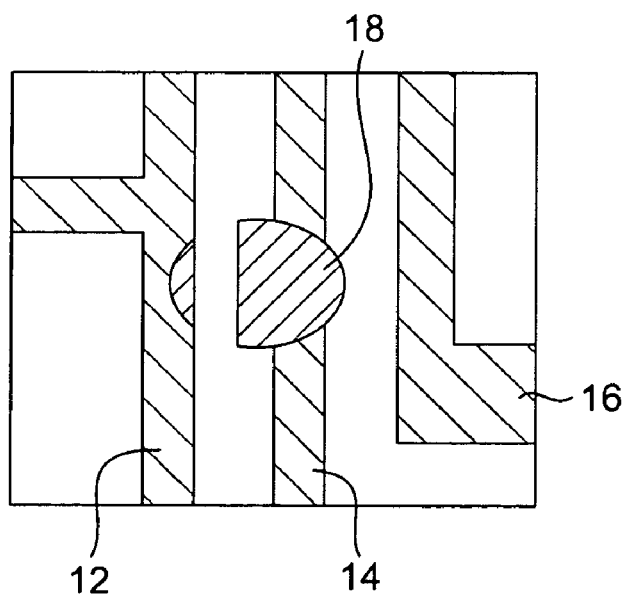

Referring now to FIG. 1A, there is shown a plan view of a small segment of a semiconductor die and, more particularly, a representation of a metal layer on a die such as, for example, metal 3. The metal layer includes a plurality of electrical conductors 12, 14 and 16. A defect 18, which may be characterized as a killer defect, short circuits conductor 12 to conductor 14. FIG. 2B shows the same die layer after repair of the killer defect by simply cutting through the defect 18 so that the electrical short between the conductor elements 12 and 14 has been eliminated.

Figure 2A:
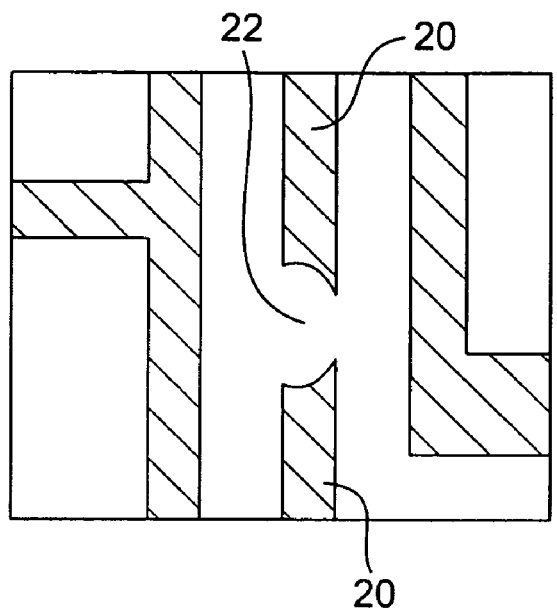
FIGS. 2A and 2B are schematic representations of an open conductor defect in a metal layer and its repair.
Figure 2B:
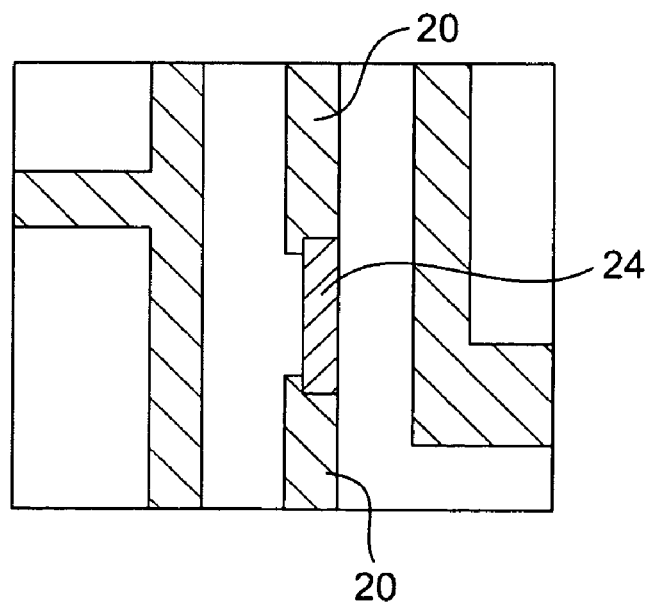

FIG. 2A illustrates another form of killer defect in a semiconductor die layer in which the electrical conductor 20 has an open or space so that continuity through the conductor element is lost. As shown in FIG. 2B, the open killer defect indicated at 22 can be repaired by creating an electrically conducting bridge between the spaced-apart ends of the conductor element 20.

The process of cutting through a killer defect such as defect 18 in FIG. 1A can be performed using an in-line focused ion beam or FIB tool to cut a trench through the shorting conductor. A concern with using the FIB tool is that such use may result in gallium contamination. However, if gallium contamination is an issue, a gallium barrier or layer that getters gallium could be incorporated into the process flow for forming the semiconductor layer after transistor formation, thereby allowing FIB cuts to be used in interconnect layers. Another possibility for cutting through such killer defects is to use laser assisted microchemical machining technology. Revise, Inc. markets a product under the designation 9850 Silicon Etcher that could be used not only for cutting through short circuiting defects, such as defect 18, but also could be used to create the repair indicated at 24 in FIG. 2B. It is also possible that micromachining using MEMS and nano technology could be adapted to affect cutting through of these micron sized defects.

Figure 3:
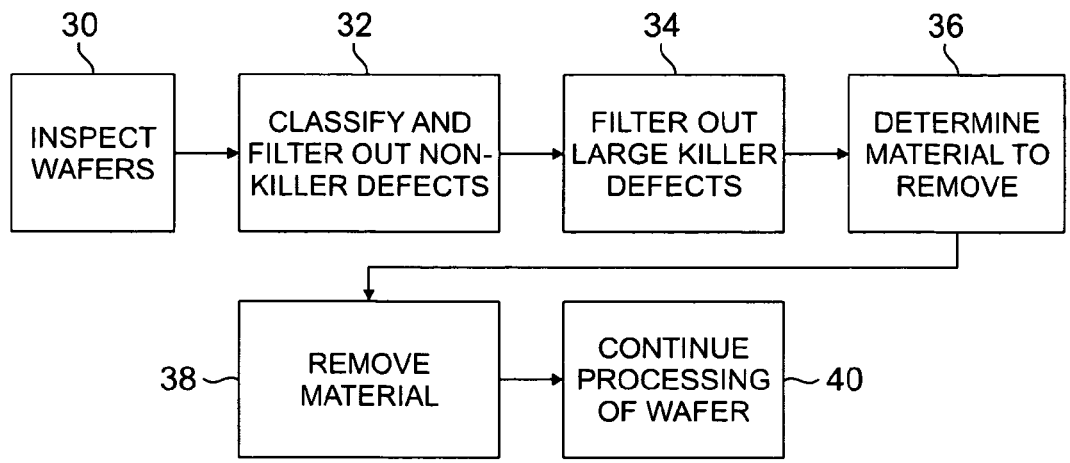
FIG. 3 is a flow chart representation of a process for defect analysis and repair.

The actual repair process involves a number of steps that are illustrated in block diagram form in FIG. 3. In a first step, block 30, the integrated circuit or die layer needs to be inspected to identify dies which have defects. Such inspection may be carried out using optical examination, laser based or even scanning electron microscope (SEM) inspection tools.

The aforementioned U.S. Pat. No. 6,047,083 describes one form of defect identification using SEM inspection tools. Once the defects have been located, further examination of each individual defect is necessary in order to be able to classify the defect as either a killer or a non-critical defect. Typically, a SEM inspection tool would be used to image the area identified as having defects so each individual defect could be manually examined. Block 32 indicates the step of classifying and filtering out defects that are non-killer or non-critical. While the SEM inspection tool is believed to be currently the best tool choice for the classification task, other alternative tools, such as optical review tools, may be suitable for this application. It is also possible that the classification process could be converted into an automated process, such as is described in the aforementioned U.S. Pat. No. 6,047,083. Killer defects may be subdivided into two subclasses, shorts and opens. To be a short, the defect must bridge two elements in the circuit and must be a conductive material. The composition may be surmised by the appearance of the defect and/or by composition analysis techniques, such as energy dispersive x-ray spectroscopy EDX. To be an open, a conductive element must be broken into two separate parts by the defect and the defect must be non-conductive.

Once the potentially killer defects have been identified, it is then necessary to filter out large defects that are not practical to repair, block 34. Generally, small defects that affect one or two elements will be easier to repair than a defect that affects three or more elements. First, only a single cut or bridge is needed and second, the defect is less likely to bridge to another level. Defects that bridge to another level are not likely repairable. Other factors in filtering out killer defects may include the success rate in repairing similar defects and the type of defect. Once the defects have been classified and filtered, the next step in the process is to determine what material has to be removed from, or added to, the die layer, block 36, in order to repair the die. After determining what material has to be removed, or what material has to be added in the case of an open conductor, the next step is to either remove the material, block 38, or deposit new material and then to return the wafer to the next process step, block 40, to complete manufacturing of the semiconductor devices.

The classification and filtering of blocks 32 and 34 can be done manually using optical or SEM examination of the die layer. Alternately, the automated identification and classification procedure described in U.S. Pat. No. 6,047,083 could be applied. However, once the devices have been sorted into those that can be repaired, the next step is to determine what material needs to be removed or which conductors need to have material added in order to repair open spaces. A brute force method would be to remove all material from a device layer that differs from the intended pattern. Such a method would be economically unfeasible both from a cost and time standpoint. Accordingly, applicants propose an improved procedure which analyzes the area of the defect and determines the simplest way to correct the defect without having to completely remove all of the defective area.

Figure 4:
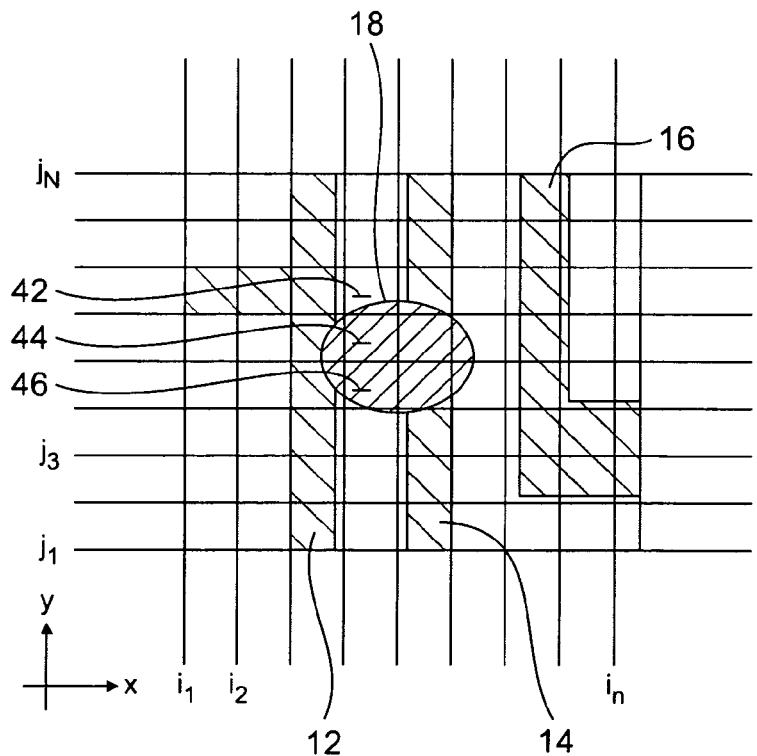
FIG. 4 illustrates a parsing process for die repair.

FIG. 4 shows a diagram of the layout of FIG. 1A in which the area containing the defect has been broken down into a grid structure forming a plurality of squares. Preferably, the grid is the same resolution as the grid used in the original design file for the die circuit being examined. The grid structure can be defined by a series of XY coordinates with the X coordinates being identified by $i_1$-$i_n$. The Y coordinates are then defined by $j_1$-$j_n$. For each column $l_1$-$l_n$, the number of squares that would have to be removed in order to clear the connection between the adjacent conductors is calculated. For example, in FIG. 4, the defect can be removed by clearing the squares 42, 44 and 46 in column 14. Each of the columns is evaluated and the number of squares that would have to be cleared in order to remove the defect is totaled in order to identify the column which would require the least number of squares to be cleared. The same analysis is then applied along the Y axis to identify the number of rows that must be cleared in order to remove the defect. Thereafter, the minimals in the rows are compared to the minimals in the columns to determine which of the rows or columns would require the least amount of change in order to remove the defect. Selection of a row or column, for example, a horizontal or vertical cut, is then based upon which cut would require the least material to be removed. In the example of FIG. 4, it is apparent that the least material is removed by selecting the column $i_4$ This scenario assumes that removal of a single row or column of squares provides sufficient resistance to effectively fix the defect and allow the device to work sufficiently. Possible it may be necessary to provide multiple square-widths of isolation between runners. This algorithm may be modified accordingly to define a minimum acceptable cut width.

Next for shorts, the depth of the cut must be determined. For full stack extras, the cut should be slightly more than the stack height. For W puddles, the cut could be a proportion of the diameter of the W puddle. For opens, the thickness of the bridge would be based on the conductivity of the material used and the composition and line width of the defective runner.

As discussed above, once the squares in the grid have been identified for removal of material and the repair thickness determined, the material removal process can be implemented by using FIB, laser assisted microchemical machining or some form of micromaching using MEMS or nano technology. Further, in the case of an open conductor, the open conductor can be repaired using a laser assisted chemical deposition technique. It should be noted that in the case of an open conductor, the analysis of the best way to correct the defect may not be as complicated since the open occurs in a conductor and the direction of the conductor will define the direction and location of the repair.

The above embodiment has been described with particular reference to a coordinate system that is square, and which thus utilizes squares as a means of localizing and quantizing the defect, and determining which quanta of localized material must be added or removed to repair the defect. One of reasonable skill in the art will readily recognize, however, that coordinate systems need not necessarily be square to locate and quantize a region of area, such as a defect. It should be readily apparent that the instant invention is equally applicable to non-square coordinate systems; that is, the defect may be localized and quantized by a coordinate system that uses a series of rectangles, or parallelograms. Indeed, it should be understood that any two-dimensional coordinate system (i, j) may be used to localize and quantize the defect, and the above method may be used to determine along which coordinates (i, j) the amount of material that must be added or removed is minimized.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

What is claimed is:

1. A method of repairing killer defects in a semiconductor die prior to completion of semiconductor processing comprising:
   identifying a die having a killer defect;
   determining a repair location and action for a minimally invasive repair via the steps of:
   defining a grid overlaying an area of the die containing the killer defect;
   analyzing the grid to locate squares in the grid containing portions of the killer defect;
   defining the grid by columns and rows; computing the number of squares in each of the columns that would require repairing to remove the killer defect;
   identifying a one of the columns having a minimum number of squares requiring repairing;
   computing the number of squares in each of the rows that would require repairing to remove the killer defect;
   a one of the rows having a minimum number of squares requiring repairing;
   comparing the minimum number of squares in the one of the columns to the minimum number of squares in the one of the rows to effect repairing; and
   selecting from the one of the columns and the one of the rows a column or row encompassing a minimum number of squares for the repair location;
   implementing the repair action at the repair location; and
   continuing processing of the semiconductor die.

2. The method of claim 1 wherein the killer defect comprises a shorting connection between conductors and the step of implementing the repair action comprises cutting the shorting connection.

3. The method of claim 2 wherein the step of cutting comprises focused ion beam etching, laser etching or microchemical machining.

4. The method of claim 1 wherein the killer defect comprises an open conductor space and the step of implementing the repair action comprises deposition of conductor material in the repair location.

5. The method of claim 4 wherein the step of deposition comprises laser assisted chemical deposition.

6. The method of claim 1 and including the further steps of determining a minimum width for repairing the defect and repairing other squares to achieve the minimum width.

7. The method of claim 6 wherein the killer defect comprises a shorting connection between conductors and the step of implementing the repair action comprises cutting the shorting connection.

8. The method of claim 6 wherein the killer defect comprises an open conductor space and the step of implementing the repair action comprises deposition of conductor material in the repair location.

9. A method of repairing killer defects in a semiconductor die prior to completion of semiconductor processing comprising: identifying a die having a killer defect;
   determining a repair location and action for a minimally invasive repair via the steps of:
   defining a grid comprising a plurality of interconnected geometrical shapes that overlay an area of the die containing the killer defect;
   analyzing the grid to locate those geometrical shapes in the grid containing portions of the killer defect;
   defining the grid by columns and rows;
   computing the number of the geometrical shapes in each of the columns that would require repairing to remove the killer defect;
   identifying a one of the columns having a minimum number of the geometrical shapes requiring repairing;
   computing the number of squares in each of the rows that would require repairing to remove the killer defect;
   identifying a one of the rows having a minimum number of squares requiring repairing;
   comparing the minimum number of the geometrical shapes in the one of the columns to the minimum number of the geometrical shapes in the one of the rows to effect repairing; and
   selecting from the one of the columns and the one of the rows a column or row encompassing a minimum number of the geometrical shapes for the repair location;
   implementing the repair action at the repair location; and
   continuing processing of the semiconductor die.

10. The method of claim 9 wherein the killer defect comprises a shorting connection between conductors and the step of implementing the repair action comprises cutting the shorting connection.

11. The method of claim 10 wherein the step of cutting comprises focused ion beam etching, laser etching or microchemical machining.

12. The method of claim 9 wherein the killer defect comprises an open conductor space and the step of implementing the repair action comprises deposition of conductor material in the repair location.

13. The method of claim 12 wherein the step of deposition comprises laser assisted chemical deposition.

14. The method of claim 9 and including the further steps of determining a minimum width for repairing the defect and repairing other of the geometrical shapes to achieve the minimum width.

15. The method of claim 9 wherein each of the geometrical shapes is a square of a resolution that is substantially the same as a grid used when originally designing the die.

16. A method of repairing killer defects in a semiconductor die prior to completion of semiconductor processing comprising:
   identifying a die having a killer defect;
   determining a repair location and action for a minimally invasive repair via the steps of:
   partitioning the repair location into a plurality of partitions utilizing a two dimensional coordinates system (i, j);
   for each value of i, computing the number of partitions along that value of i that would require repairing to remove the killer defect;
   identifying a one of the values for i having a minimum number of partitions requiring repairing;
   for each value of i, computincl the number of partitions along that value of j that would require repairing to remove the killer defect;
   identifying a one of the values for j having a minimum number of partitions requiring repairing;
   comparing the minimum number of partitions in the one of the values of i to the minimum number of partitions in the one of the values of j to effect repairing; and
   selecting as the repair location the partitions requiring repair in the one of the values of i or the one of the values of j that encompasses a minimum number of partitions for the repair location;
   implementing the repair action at the repair location; and
   continuing processing of the semiconductor die.

17. The method of claim 16 wherein the killer defect comprises a shorting connection between conductors and the step of implementing the repair action comprises cutting the shorting connection.

18. The method of claim 17 wherein the step of cutting comprises focused ion beam etching, laser etching or microchemical machining.

19. The method of claim 16 wherein the killer defect comprises an open conductor space and the step of implementing the repair action comprises deposition of conductor material in the repair location.

20. The method of claim 19 wherein the step of deposition comprises laser assisted chemical deposition.

21. The method of claim 16 and including the further steps of determining a minimum width for repairing the defect and repairing other partitions to achieve the minimum width.

22. The method of claim 16 wherein each of the partitions is a square.

* * * * *